United States Patent [19]

Polyak et al.

[11] Patent Number: 5,139,383

[45] Date of Patent: Aug. 18, 1992

[54] DEVICE FOR POSITIONING OBJECTS WITHIN A SEALED CHAMBER

[75] Inventors: Alexander Polyak, San Jose; Thu Huynh, Fremont, both of Calif.

[73] Assignee: Huntington Mechanical Laboratories, Inc., Mountain View, Calif.

[21] Appl. No.: 734,473

[22] Filed: Jul. 23, 1991

[51] Int. Cl.$^5$ ............................................... B25J 1/08
[52] U.S. Cl. .......................................... 414/3; 74/110; 294/88; 294/116; 403/DIG. 1; 414/753; 464/29
[58] Field of Search .................. 414/1, 3, 217, 749, 414/753, 8; 294/88, 115, 116; 74/110; 403/DIG. 1; 464/29

[56] References Cited

U.S. PATENT DOCUMENTS

| | | | |
|---|---|---|---|
| 4,683,763 | 8/1987 | Balter | 74/18.1 |
| 4,768,911 | 9/1988 | Balter | 414/3 |
| 4,797,053 | 1/1989 | Balter | 414/749 |
| 4,850,779 | 7/1989 | Cashell et al. | 414/3 |
| 4,885,947 | 12/1989 | Balter et al. | 74/18.1 |
| 4,998,859 | 3/1991 | Oshima et al. | 414/751 X |

Primary Examiner—Robert J. Spar
Assistant Examiner—Donald W. Underwood
Attorney, Agent, or Firm—David Pressman

[57] ABSTRACT

A device for positioning objects within a sealed vacuum chamber (112) comprises a stationay housing (114), which is sealingly attached to the vacuum chamber (112). Located within the housing (114) is a tubular body (158) capable of rotating and translating within the stationary housing (114) through the interaction of an outer magnet (116), which slides and rotates on the surface of the stationary housing, and an inner magnet (118), which is attached to the tubular body (158). A shaft (198) is located inside the tubular body, but cannot be shifted axially with respect to this body. The front end of shaft (198) extends into the vacuum chamber (112) and may carry a specimen or any other object to be treated or tested in the vacuum chamber. The shaft (198) is driven from an external drive mechanism (124). Rotation of the shaft can be converted into opening and closing movements of the jaws (218 and 220). Thus, the object can be clamped by the jaws, rotated, and linearly moved inside a sealed chamber under the control of external drive means.

20 Claims, 3 Drawing Sheets

DEVICE FOR POSITIONING OBJECTS WITHIN A SEALED CHAMBER

BACKGROUND

1. Field of the Invention

The present invention relates to a device for positioning objects within a sealed chamber, specifically to such a device which combines rotary and translatory motions and can move samples within a vacuum deposition chamber or can transfer samples from one vacuum chamber to another.

2. Description of Prior Art

It is often desirable or necessary to move objects within a closed chamber, such as a vacuum chamber. Such movement usually is done by a shaft, which extends into the chamber so that translatory and rotary motions can be imparted into the chamber via the shaft from outside the chamber. The chamber should remain sealed at all times so as to constitute a closed system.

This is especially true in vacuum chambers where it would be clearly impractical to shut the system down merely to rotate the shaft or move it in an axial direction.

One example of the need to move objects within a vacuum chamber occurs when it is necessary or desirable to change the position of a semiconductive substrate or test specimen with respect to a measuring instrument or ray emitting device, such as an electron beam gun located in predetermined axial and angular positions with respect to a substrate in the chamber. Feedthrough mechanisms or manipulators were known to be used in the past for these purposes.

One such mechanism, which is shown in FIG. 1, is described in U.S. Pat. No. 4,768,911 to V. Balter, 1988. This Balter mechanism comprises a tubular housing 12 made from a magnetically permeable material. Housing 12 is closed at one end and open at the other end for attachment to a vacuum chamber 18 through an appropriate seal 21. Located inside housing 12 is a shaft 40, which has a square cross section. One end of shaft 40 is rotatingly connected to an inner permanent magnet 66, which can rotate with respect to shaft 40, but moves axially together therewith. Inner magnet 66 interacts with an outer magnet 70, which is slidingly installed on the outer surface of housing 12. The other end of shaft 40 protrudes into vacuum chamber 18 and may carry a specimen, such as a silicone substrate S, or another object to be accurately positioned and treated in vacuum. Shaft 40 is supported inside the housing by a bevel gear 32, which has a square opening 38 for guiding the above-mentioned square shaft during its axial movements. Gear 32 is a part of an angular feedthrough mechanism 80, which has another bevel gear 98 engaged with gear 32. Feedthrough mechanism 80 has its drive element outside the housing. Angular feedthrough mechanism 80 is used for imparting rotary motion to shaft 40. Movement of outer magnet 70 along tubular housing 12 transmits axial movements to shaft 40 via inner magnet 66 attached to this shaft. This device can transfer a specimen from one chamber to another by axial movement of shaft 40 and can position the specimen in either chamber in any desired axial and angular orientation for treatment or measurement.

However, the angular feedthrough mechanism 80, which is used in the Balter system, occupies useful space and limits the amount of axial movement of the specimen. In addition, the system has only two degrees of freedom (i.e., one axial and one rotary) and moves only the specimen. In some cases, however, it may be required to impart motions not only to a specimen, but also to an actuating mechanism, such as a clamping member, which can rotate with respect to a specimen, while the latter rotates and can be axially moved relative to the clamping member.

Another disadvantage of the Balter mechanism is that it has a sliding movement which involves surface-to-surface friction. After many cycles of operation of the device, such friction causes wear of contacting parts so that accuracy of operation of the mechanism can be impaired and worn-off particles may adversely contaminate a specimen of high purity, e.g., a semiconductor wafer.

OBJECTS AND ADVANTAGES OF THE INVENTION

It is therefore an object of the invention to eliminate the above disadvantages. Other objects are to provide a device for moving objects within and between sealed chambers, which has on its output end three degrees of motion, imparts motions not only to a specimen, but also to an actuating member such as a clamp, ensures a greater range of movement in the axial direction, has no sliding friction contact on parts which move in axial and angular directions with respect to each other, and is free of wear and therefore maintains accuracy of its operation. Further advantages and features of the invention will become apparent from a consideration of the ensuing description and drawings.

REFERENCE NUMERALS USED IN THE DRAWINGS AND DESCRIPTION

Figure 1:
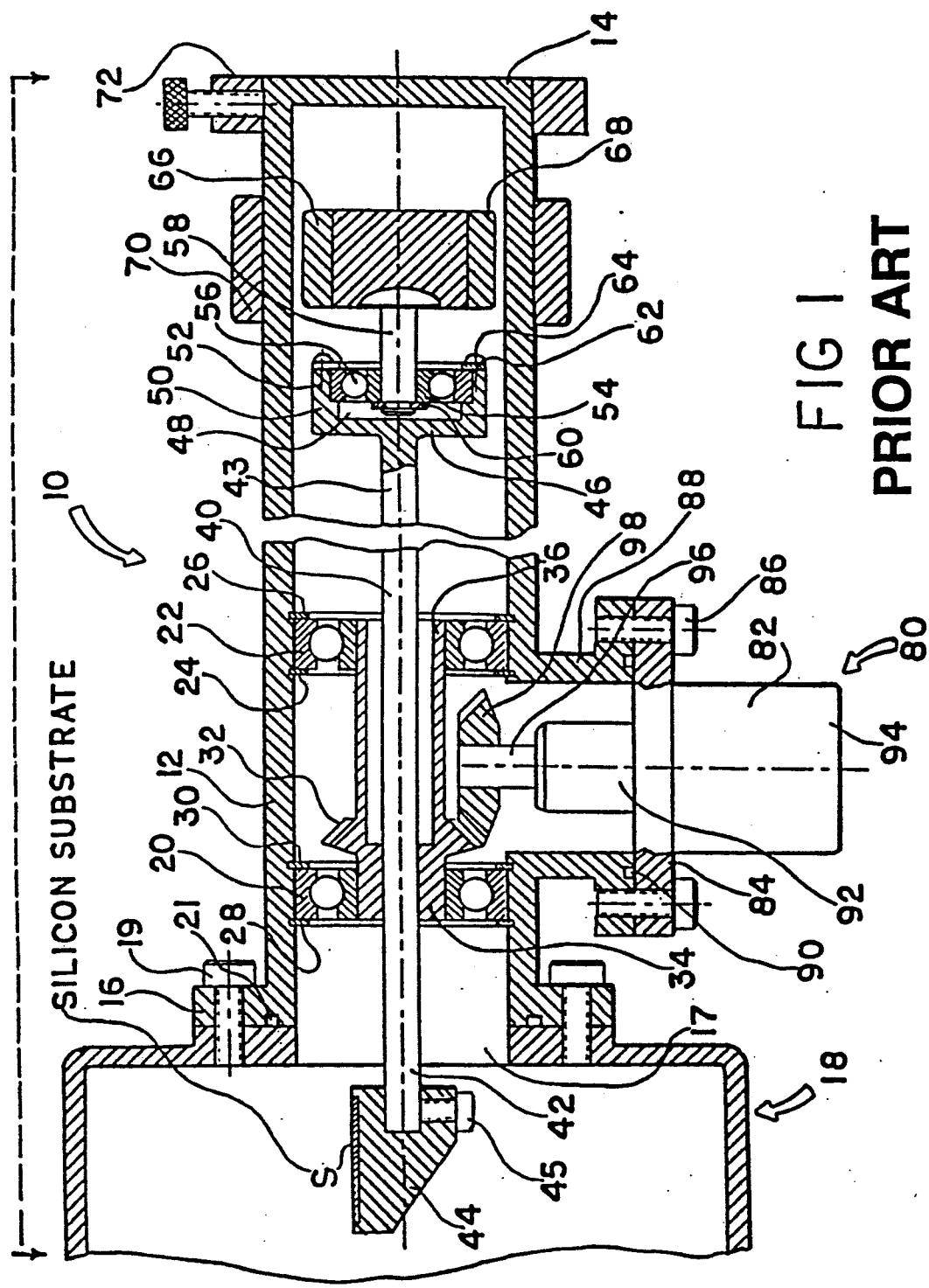
FIG. 1 is a longitudinal sectional view of a prior art device.

110—vacuum chamber housing
112—vacuum chamber
114—stationary cylindrical housing
116—outer magnet
118—inner magnet
120—front stop
122—rear stop
124—secondary feedthrough mechanism
126—front flange
128—rear flange
130—front mini-flange
132—rear mini-flange
134, 136, 138, 140—bolts
142, 144—nuts
146, 147, 148, 149, 150, 151, 152, 153, 154, 156—welds
158—inner tubular housing
160—driven shaft housing
162, 164—knife-edge type seals
166—output shaft
168, 170, 172, 174, 176, 178—ball bearings
180—hub
182—rotary drive shaft
184—cap
186, 188—linear ball bushings
190—bearing mount 192—supporting flange
194—intermediate sleeve
196—mounting sleeve
198—driven shaft
200—portion of the driven shaft
202—coupling
204, 206, 208, 210, 212, 214—retaining rings
216—jaw housing
218, 220—jaws
222, 224—pins
226—spacer
228—housing cylinder
230, 231—toothed segments
232—thin-walled tube
234—key
236—slot
237—threaded end of driven shaft
238—gap

DETAILED DESCRIPTION OF THE APPARATUS OF THE INVENTION

Figure 2:
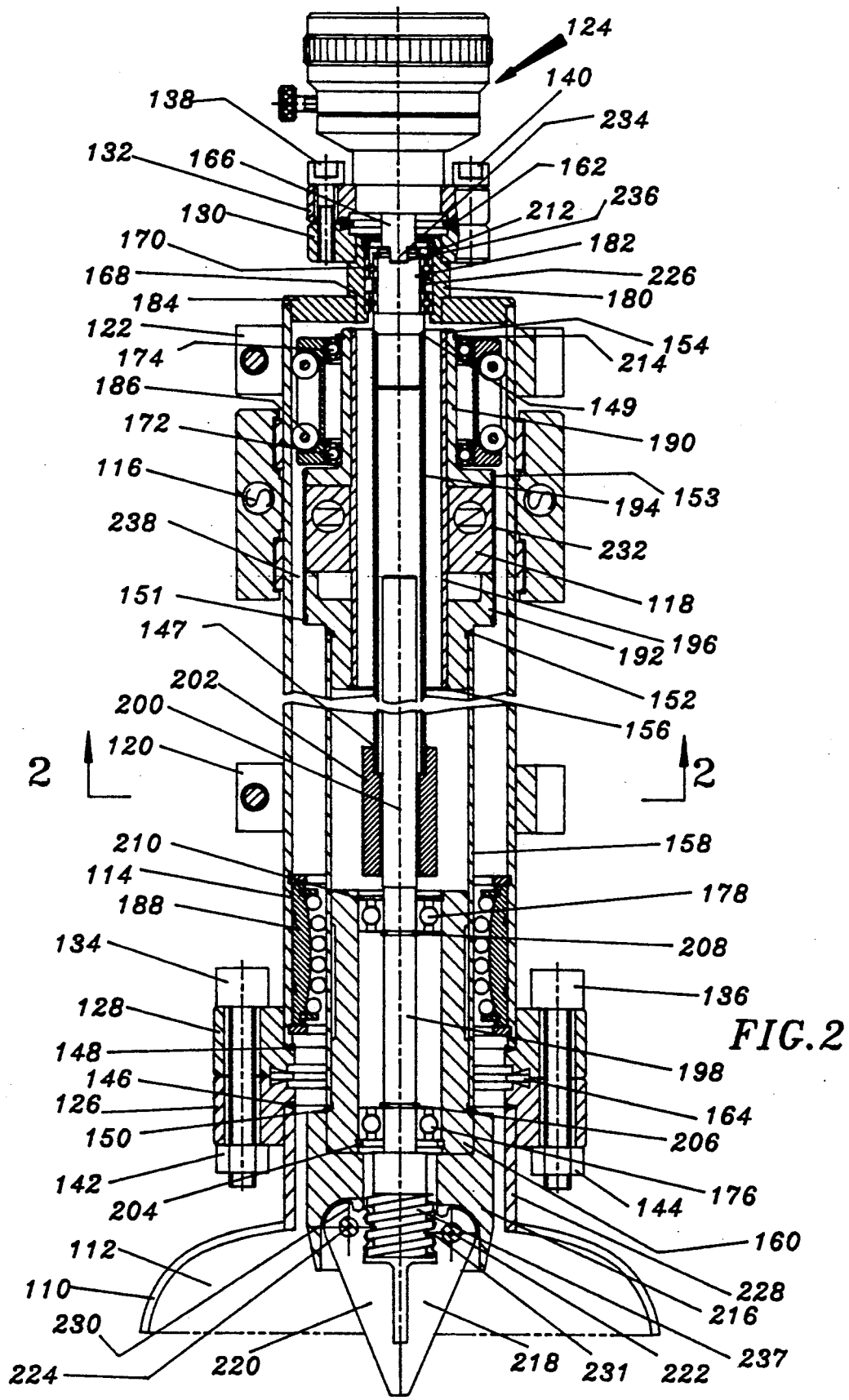
FIG. 2 is a longitudinal sectional view of a motion-transmitting device of the invention.

FIG. 2 shows a longitudinal sectional view of a motion-transmitting device of the invention. The rotary and linear motion feedthrough mechanism depicted in FIG. 2 includes a driven shaft 198 with a portion 200 that has a square cross-section. Portion 200 serves as a means of slidingly attaching shaft 198 to a cylindrical intermediate sleeve 194 with a coupling 202. Coupling 202 has a square-shaped central opening 202a (FIG. 3), which guides square-shaped portion 200 of shaft 198. A weld seam 147 rigidly connects coupling 202 to sleeve 194. Sleeve 194 fits through a mounting sleeve 196, on the outside of which a cylindrical inner magnet 118 is secured with a thin-walled tube 232 between a supporting flange 192 and a bearing mount 190. Magnet 118 is made, for example, of the rare-earth sintered alloy samarium cobalt. Tube 232 is made of magnetically permeable material such as stainless steel. Weld seams 154 and 156 bond mount 190 and flange 192 to sleeve 196, while weld seams 151 and 153 attach tube 232 to flange 192 and mount 190. Shaft 198 is rotatingly supported at the front by ball bearings 176 and 178, which are secured inside a driven shaft housing 160 with retaining rings 204, 206, 208, and 210.

Sleeve 194 is rigidly attached to a rotary drive shaft 182 by a weld seam 149. A shaft 182, which is rotatingly supported by ball bearings 168 and 170 inside a hub 180, is coupled to a key 234 of an output shaft 166 by means of a slot 236. Bearings 168 and 170 are separated by a spacer 226. Shaft 166 is rigidly connected to a drive unit, such as a secondary feedthrough mechanism 124, the front portion of which is housed by a rear mini-flange 132.

Bolts 138 and 140 attach a front mini-flange 130 to rear mini-flange 132. A knife-edge type seal 162 is positioned between the flanges; the seal isolates shaft 166 from the atmosphere.

Hub 180 is inserted into a cap 184, which is mounted into the rear cavity of a stationary cylinder housing 114. Cap 184 closes the rear opening of housing 114 and is attached thereto, e.g., by a seal weld seam (not shown). Externally, a rear adjustable stop 122 is attached to the back portion of housing 114, while a front adjustable stop 120 is mounted near the front of housing 114. An outer magnet 116, made of the same material as inner magnet 118, is positioned between stops 120 and 122 in such a way that it can rotate around the surface of housing 114 and slide between the stops.

The inner diameter of housing 114 is greater than the outer diameter of inner magnet 118; this provides a gap 238 between housing 114 and magnet 118. This gap allows magnet 118 to slide and rotate freely within housing 114 so that a contactless positive connection is obtained between both magnets. As a result, axial and angular movements of outer magnet 116 will be transmitted through a magnetic attraction force to inner magnet 118.

A rear flange 128 is welded to housing 114 at a location 148, with a front flange 126 attached to flange 128 by means of bolts 134 and 136, and nuts 142 and 144. Front flange 126 is welded to a housing cylinder 228 at a seam 146. In turn, housing cylinder 228 is rigidly attached to a vacuum chamber housing 110. Jaws 218 and 220 are located inside housing 110 and are pivotally mounted into a clamp housing 216 by means of pins 222 and 224. Housing 216 is rigidly attached to housing 160 with a weld seam 150, which is also used to secure housing 160 inside an inner tubular housing 158. A threaded end 237 of shaft 198 is inserted between the pinned ends of jaws 218 and 220. Toothed segments 230 and 231 of the jaws engage with the threaded shaft end.

Housing 158 is mounted inside housing 114 by means of linear ball bushings 186 and 188 and ball bearings 172 and 174; these allow the housing to translate and rotate. Linear ball bushing 188 is rigidly attached inside housing 114 at the front end thereof. Linear ball bushing 186 is mounted onto ball bearings 172 and 174, which in turn are secured to bearing mount 190 with a retaining ring 214.

The described mechanism allows jaws 218 and 220 to execute translational and rotational motion within vacuum chamber 112.

This is possible because they move as a unit with inner magnet 118, which is positioned by outer magnet 116. Additionally, the jaws can be opened and closed by secondary feedthrough mechanism 124. Thus, an object (not shown), such as a semiconductor wafer sample, can be placed into any desired position within sealed vacuum chamber 112.

At the front, the inside of housing 144 is isolated from the atmosphere by a knife-edge seal 164, positioned between flanges 126 and 128.

All parts of the device, such as housing 114, tubular housing 158, driven shaft 198, and other parts operating in deep vacuum, are made of stainless steel.

In one specific embodiment of the invention, the positioning device had an overall length of about 120 cm. The outer diameter of housing 114 was 75 mm. The maximum longitudinal stroke of jaws 218 and 220 was 105 cm.

OPERATION

Figure 3:
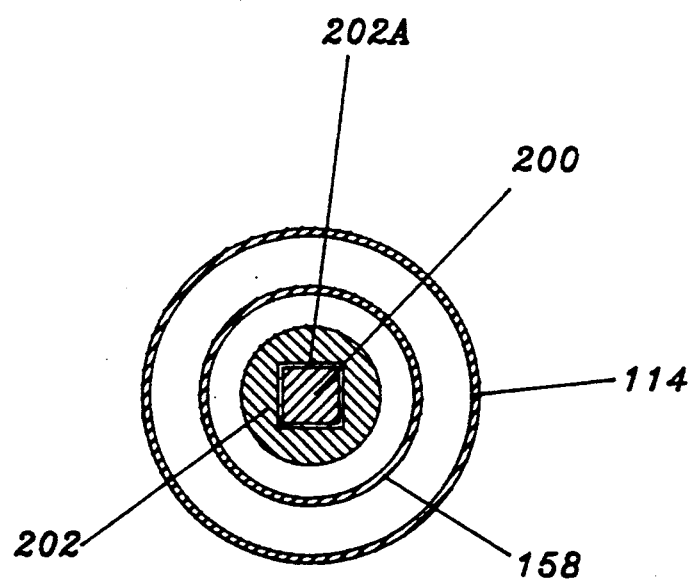
FIG. 3 is a cross-sectional view taken along line 2—2 in FIG. 2.

The motion transmitting device shown in FIGS. 2 and 3 is able to control angular and longitudinal position of a sample holder (not shown) inside vacuum chamber 112. It is, however, understood that this device is given only as an example and that the invention is not limited to the system of this particular construction. The device of this embodiment of the invention operates as follows:

Prior to operation, a sample (not shown) is placed onto the sample holder (not shown) inside vacuum chamber 112. A vacuum is then created in the vacuum chamber by its usual vacuum pump (not shown).

Secondary feedthrough mechanism 124 is rotated manually or from a programmed device (not shown) through a stepper motor (not shown). Since output shaft 166 of feedthrough mechanism 124 is coupled to rotary drive shaft 182, which is in turn rigidly connected to driven shaft 198, rotary motion of the secondary feedthrough mechanism is transferred to threaded end 237 of the driven shaft. The engagement between the threaded end of the driven shaft and toothed segments 230 and 231 of jaws 118 and 120 causes the jaws to open when the secondary feedthrough mechanism is turned clockwise and closes the jaws when the mechanism is rotated counterclockwise.

Rotation of driven shaft 198 contributes only to clamping motion of jaws 118 and 120, because shaft 198 is mounted on bearings 176 and 178, which allow shaft 198 to rotate independently of jaw housing 116.

The angular and longitudinal positions of the sample holder within vacuum chamber 112 are adjusted by rotating and translating outer magnet 116, either manually or by means of actuating mechanisms and pulse motors (not shown). Inner magnet 118 follows the movements of the outer magnet, thereby causing jaw housing 116, which is linked directly to the inner magnet by inner tubular housing 158, to undergo translatory and rotary motions. Linear ball bushings 186 and 188, along with ball bearings 172 and 174, allow the inner assembly, comprising jaws 118 and 120, jaw housing 116, driven shaft housing 180, inner tubular housing 158, driven shaft 198, and magnet 118 with its supporting flanges and band, to have unlimited angular motion and to translate longitudinally between stops 120 and 122, which restrict movements of outer magnet 116. The range of longitudinal motion and reach of the jaws inside the vacuum chamber can be adjusted by repositioning stops 120 and 122, attached to housing 114.

SUMMARY, RAMIFICATIONS, SCOPE

Thus, it has been shown that the positioning device provides an apparatus for moving objects within and between sealed chambers, which has on its output end three degrees of motion, imparts motions not only to a specimen, but also to an actuating member such as a clamp, ensures a greater range of movement in the axial direction, has rolling contact on all parts which move both in axial and angular directions with respect to each other, and is free of wear and therefore maintains accuracy of its operation.

Although the device had been shown and described in the form of one specific embodiment, this embodiment, its parts, materials, and configurations have been given only as examples, and many other modifications of the device are possible. For example, the executive mechanism of the device can be made not in the form of clamping jaws 118 and 120, but in any other configuration, e.g., as a rotating pusher. A different drive mechanism can be used for rotating shaft 198, instead of a standard feedthrough device. The sample transfer device can be used for manipulation of hazardous substances or radioactive materials, rather than for vacuum applications. The device may have different dimensions and its parts, as well as its magnets, can be formed of different materials. Electric magnets can be used instead of permanent magnets.

Therefore, the scope of the invention should be determined, not by the example given, but by the appended claims and their legal equivalents.

What we claim is:

1. A device for positioning objects within a sealed chamber comprising:

a tubular housing closed at one end thereof and open at another end thereof;

means located at said open end for attaching said housing to said sealed chamber;

an outer tubular elongated body located in said tubular housing, said outer tubular elongated body being moveable axially inside said tubular housing and being capable of rotating therein, said outer tubular elongated body having one end located near said closed end of said tubular housing, and a second end capable of protruding from said tubular housing through said open end thereof into said chamber;

an inner elongated body located inside said outer tubular elongated body, said inner elongated body having one end located near said closed end of said tubular housing and a second end located near said second end of said outer tubular elongated body;

means for rotating said inner elongated body with respect to said outer tubular elongated body;

means for imparting a translatory and a rotary motion to said outer tubular elongated body, said means for imparting translatory and rotary motion having a drive portion located outside said tubular housing and moveable axially along said tubular housing and angularly with respect thereto, and a driven portion located inside said tubular housing and rigidly connected to said outer tubular elongated body;

means for moving said inner elongated body axially and angularly together with said outer tubular elongated body when said outer tubular elongated body is moved by said motion means for imparting a translatory and a rotary motion; and object holding means for supporting an object at said second end of said inner elongated body.

2. The device of claim 1 wherein said means for rotating said inner elongated body with respect to said outer tubular elongated body comprises a rotating drive unit located outside said tubular housing and attached thereto through a sealing device, said rotating drive unit being rigidly attached to said first end of said inner elongated body.

3. The device of claim 2 wherein said means for imparting a translatory and a rotary motion to said outer tubular elongated body comprises an outer permanent magnet, which slides over the surface of said tubular housing and can rotate thereon, and an inner permanent magnet, which has a polarity opposite to that of said outer permanent magnet and which is rigidly attached to said first end of said outer tubular elongated body, said inner permanent magnet being installed inside said tubular housing with a large enough gap between the periphery of said inner magnet and the inner surface of said tubular housing to provide free movement of said inner magnet inside said tubular housing.

4. The device of claim 2 wherein said means for moving said inner elongated body axially and angularly together with said outer tubular elongated body comprise means for rotatingly supporting said second end of said inner elongated body and means for preventing said inner elongated body against axial movement with respect to said outer tubular elongated body.

5. The device of claim 4 wherein said means for rotatingly supporting said second end of said inner elongated body comprises at least one ball bearing, and said means for preventing said inner elongated body against axial movement with respect to said outer tubular elongated body comprise a first retaining ring, which is inserted into said outer elongated body, and a second retaining ring, which is inserted into said inner elongated body, said bearing being located between said first retaining ring and said second retaining ring.

6. The device of claim 2 wherein said inner elongated body comprises a sleeve drivingly connected to said rotating drive unit at said first end of said inner elongated body, and a shaft telescopically inserted into said sleeve, said sleeve having slide means for allowing said shaft to slide inside said sleeve and preventing said shaft from rotating relative to said sleeve.

7. The device of claim 2, further including a first linear ball bearing at said first end of said outer tubular elongated body and a second linear ball bearing at said second end of said outer tubular elongated body, said first linear ball bearing and said second linear ball bearing being installed in said tubular housing and movably supporting said outer tubular elongated body for its axial movement inside said tubular housing.

8. The device of claim 6 wherein said slide means comprise a profile opening, at least on a part of the length of said sleeve, and at least a portion of said shaft having a cross section corresponding to said profile opening, said portion of said shaft being slidingly inserted into said profile opening.

9. The device of claim 2 wherein said second end of said inner elongated body has a threaded portion, said second end of said outer tubular elongated body has pivotally mounted elements with teeth engaging said threaded portion, so that the rotation of said inner elongated body causes said elements to open or close.

10. A device for positioning objects within a sealed chamber comprising:
a tubular housing closed at one end thereof and open at another end thereof;
means located at said open end for attaching said tubular housing to said sealed chamber;
an outer tubular elongated body located in said tubular housing, said outer tubular elongated body being moveable axially inside said housing and being capable of rotating therein, said outer tubular elongated body having one end located near said closed end of said tubular housing, and a second end capable of protruding from said tubular housing through said open end thereof into said sealed chamber;
an inner elongated body located inside said outer tubular elongated body, said inner elongated body having one end located near said closed end of said tubular housing and a second end located near said second end of said outer tubular elongated body;
means for rotating said inner elongated body with respect to said outer tubular elongated body;
means for imparting a translatory and a rotary motion to said outer tubular elongated body, said means for imparting a translatory and a rotary motion having a drive portion located outside said tubular housing and moveable axially along said tubular housing and angularly with respect thereto, and a driven portion located inside said tubular housing and rigidly connected to said outer tubular elongated body;
means for moving said inner elongated body axially and angularly together with said outer tubular elongated body when said outer tubular elongated body is moved by said means for imparting a translatory and a rotary motion;
object holding means for supporting an object at said second end of said inner elongated body, said means for rotating said inner elongated body with respect to said outer tubular elongated body comprising a rotating drive unit located outside said tubular housing and attached thereto through a sealing device, said rotating drive means being rigidly attached to said first end of said inner elongated body;
said inner elongated body comprising a sleeve drivingly connected to said rotating drive unit at said first end of said inner elongated body, and a shaft telescopically inserted into said sleeve, said sleeve having slide means, which allow said shaft to slide inside said sleeve but which prevent said shaft from rotating relative to said sleeve.

11. The device of claim 10 wherein said means for imparting a translatory and rotary motion to said outer tubular elongated body comprises an outer permanent magnet, which slides over the surface of said tubular housing and can rotate thereon, and an inner permanent magnet, which has a polarity opposite to that of said outer permanent magnet and which is rigidly attached to said first end of said outer tubular elongated body, said inner permanent magnet being installed inside said tubular housing with a gap large enough to provide free movement of said inner magnet inside said tubular housing.

12. The device of claim 10 wherein said means for moving said inner elongated body axially and angularly together with said outer tubular elongated body comprise means for rotatingly supporting said second end of said inner elongated body and means for preventing said inner elongated body against axial movement with respect to said outer tubular elongated body.

13. The device of claim 12 wherein said means for rotatingly supporting said second end of said inner elongated body comprise at least one ball bearing, and said axial movement preventing means comprise a first retaining ring, which is inserted into said outer tubular elongated body, and a second retaining ring, which is inserted into said inner elongated body, said bearing being located between said first retaining ring and said second retaining ring.

14. The device of claim 13, further including a first linear ball bearing at said first end of said outer tubular elongated body and a second linear ball bearing at said second end of said outer tubular elongated body, said first linear ball bearing and said second linear ball bearing being installed in said tubular housing and movably supporting said outer tubular elongated body for its axial movement inside said tubular housing, said means, which allow said shaft to slide but not to rotate relatively to said sleeve comprising a profile opening, at least on a part of the length of said sleeve, and at least a portion of said shaft having a cross section corresponding to said profile opening, said portion of said shaft slidingly inserted into said profile opening.

15. The device of claim 14 wherein said second end of said inner elongated body has a threaded portion, said second end of said outer tubular elongated body has pivotally mounted elements with teeth engaging said threaded portion, so that the rotation of said inner elongated means causes said elements to open or close.

16. A device for positioning objects within a sealed chamber comprising:
a tubular housing closed at one end thereof and open at another end thereof;

a sealed flange connection between said open end of said tubular housing and said sealed chamber;

an outer tubular elongated body located in said tubular housing, said outer tubular elongated body being moveable axially inside said tubular housing and being capable of rotating therein, said outer tubular elongated body having one end located near said closed end of said tubular housing, and a second end capable of protruding from said tubular housing through said open end thereof into said sealed chamber;

an inner elongated body located inside said outer tubular elongated body, said inner elongated body having one end located near said closed end of said tubular housing and a second end located near said second end of said outer tubular elongated body;

a rotating drive unit located outside said tubular housing and having an output member coupled through a sealed connection with said first end of said inner elongated body;

means for imparting a translatory and rotary motion to said outer tubular elongated body comprising an outer permanent magnet, which slides over the surface of said tubular housing and can rotate thereon, and an inner permanent magnet, which has a polarity opposite to that of said outer permanent magnet and which is rigidly attached to said first end of said outer tubular elongated body, said inner permanent magnet being installed inside said tubular housing with a large enough gap between the periphery of said inner magnet and the inner surface of said tubular housing to provide free movement of said inner magnet inside said tubular housing;

means for moving said inner elongated body axially together with said outer tubular elongated body when said outer tubular elongated body is moved by said means for imparting translatory and rotary motion;

object holding means for supporting an object at said second end of said inner elongated body, said means for rotating said inner elongated body with respect to said outer tubular elongated body comprising a rotating drive unit located outside said tubular housing and attached thereto through a sealing device, said rotating drive means being rigidly attached to said first end of said inner elongated body;

said inner elongated body comprising a sleeve drivingly connected to said rotating drive unit at said first end of said inner elongated body, and a shaft telescopically inserted into said sleeve, said sleeve having slide means for allowing said shaft to slide inside said sleeve and preventing said shaft from rotating relative to said sleeve.

17. The device of claim 16 wherein said means for moving said inner elongated means axially and angularly together with said outer tubular elongated body comprise means for rotatingly supporting said second end of said inner elongated body and means for preventing said inner elongated body against axial movement with respect to said outer tubular elongated body.

18. The device of claim 17 wherein said rotatingly supporting means comprise at least one ball bearing, and said means for preventing said inner elongated body against axial movement with respect to said outer elongated body comprise a first retaining ring, which is inserted into said outer elongated body, and a second retaining ring, which is inserted into said inner elongated body, said bearing being located between said first retaining ring and said second retaining ring.

19. The device of claim 18, further including a first linear ball bearing at said first end of said outer tubular elongated body and a second linear ball bearing at said second end of said outer tubular elongated body, said first linear ball bearing and said second linear ball bearing being installed in said tubular housing and movably supporting said outer tubular elongated body for its axial movement inside said tubular housing, said slide means comprising a profile opening, at least on a part of the length of said sleeve, and at least a portion of said shaft having a cross section corresponding to said profile opening, said portion of said shaft slidingly inserted into said profile opening.

20. The device of claim 19 wherein said second end of said inner elongated body has a threaded portion, said second end of said outer tubular elongated body has pivotally mounted elements with teeth engaging said threaded portion, so that the rotation of said inner elongated body causes said elements to open or close.

* * * * *